(12) United States Patent
Kuttner

(10) Patent No.: US 9,525,383 B2
(45) Date of Patent: Dec. 20, 2016

(54) APPARATUS AND METHODS FOR A CAPACITIVE DIGITAL-TO-ANALOG CONVERTER BASED POWER AMPLIFIER

(71) Applicant: Intel IP Corporation, Santa Clara, CA (US)

(72) Inventor: Franz Kuttner, St. Ulrich (AT)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 14/570,879

(22) Filed: Dec. 15, 2014

(65) Prior Publication Data

US 2016/0173032 A1 Jun. 16, 2016

(51) Int. Cl.

| | |
|---|---|
| H04K 1/02 | (2006.01) |
| H04L 25/03 | (2006.01) |
| H04L 25/49 | (2006.01) |
| H03F 1/02 | (2006.01) |
| H03F 3/217 | (2006.01) |
| H03F 3/19 | (2006.01) |
| H04B 1/04 | (2006.01) |
| H03F 1/56 | (2006.01) |
| H03F 3/00 | (2006.01) |

(Continued)

(52) U.S. Cl.
CPC ............ *H03F 1/0205* (2013.01); *H03F 1/565* (2013.01); *H03F 3/005* (2013.01); *H03F 3/189* (2013.01); *H03F 3/19* (2013.01); *H03F 3/211* (2013.01); *H03F 3/2175* (2013.01); *H03F 3/2176* (2013.01); *H03F 3/24* (2013.01); *H04B 1/04* (2013.01); *H03F 2200/171* (2013.01); *H03F 2200/378* (2013.01); *H03F 2200/387* (2013.01); *H03F 2200/391* (2013.01); *H03F 2200/451* (2013.01); *H03F 2200/541* (2013.01); *H04B 2001/0408* (2013.01)

(58) Field of Classification Search
None
See application file for complete search history.

(56) References Cited

U.S. PATENT DOCUMENTS

| | | | |
|---|---|---|---|
| 8,674,867 B1 * | 3/2014 | Klepser | ................... H01F 21/12 341/144 |
| 2006/0038710 A1 * | 2/2006 | Staszewski | ............... H03F 3/24 341/143 |

(Continued)

*Primary Examiner* — Shuwang Liu
*Assistant Examiner* — Gina McKie
(74) *Attorney, Agent, or Firm* — Schwegman Lundberg & Woessner, P.A.

(57) ABSTRACT

This application provides apparatus and methods for a capacitive digital-to-analog converter (CDAC) based power amplifier. In an example, a transmitter amplifier can include an input inductor, a switch having a first node coupled to the input inductor, and a control node, the amplifier configured to receive a first analog representation of an envelope signal at the first node, to receive a second analog representation of the amplitude signal from the inductor, to receive a phase signal at the control node, and to provide a first modulated signal using the phase signal, the first analog representation of the amplitude signal and the second analog representation of the amplitude signal, and a capacitive digital-to-analog converter (CDAC) configured to receive a digital representation of the amplitude signal and to provide the first analog representation of the amplitude signal.

21 Claims, 8 Drawing Sheets

(51) Int. Cl.
  *H03F 3/189* (2006.01)
  *H03F 3/21* (2006.01)
  *H03F 3/24* (2006.01)

(56) References Cited

U.S. PATENT DOCUMENTS

2009/0004981 A1* 1/2009 Eliezer .................. H03F 1/0211
  455/127.1
2012/0286981 A1* 11/2012 Satarzadeh ......... H03M 1/1265
  341/122

* cited by examiner

APPARATUS AND METHODS FOR A CAPACITIVE DIGITAL-TO-ANALOG CONVERTER BASED POWER AMPLIFIER

TECHNICAL FIELD

The present subject matter pertains to power amplifiers. Some embodiments relate to wireless communications. Some embodiments relate to cellular networks including 3rd Generation Partnership Project (3GPP) long-term evolution (LTE) networks

BACKGROUND

Digital polar transmitter (DPTX) architectures are very attractive for modern radios, because such architectures can provide improved area and power consumption characteristics compared with conventional analog architectures. Polar modulation techniques can require linear wideband transmitters with efficient operation at all output levels. E-class amplifiers have certain characteristics that make them attractive for digital polar transmitters. However, for higher modulation bandwidth requirements such as those associated with LTE systems, current E-Class amplifier architectures cannot transfer the envelope signal bandwidth.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
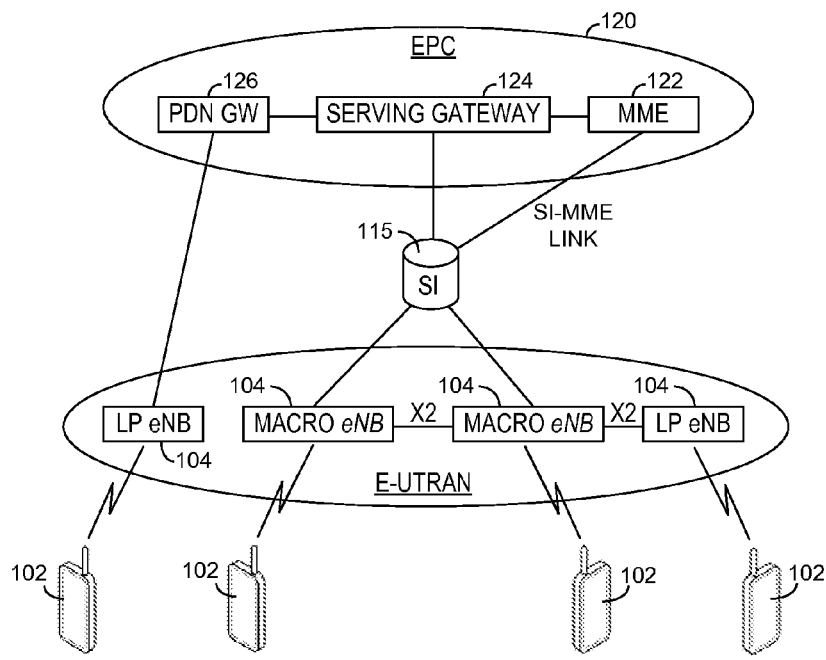
FIG. 1 illustrates a portion of an end-to-end network architecture of an LTE network with various components of the network, in accordance with some embodiments.

FIG. 1 shows a portion of an end-to-end network architecture of a LTE network with various components of the network in accordance with some embodiments. The network comprises a radio access network (RAN) (e.g., as depicted, an evolved universal terrestrial radio access network (E-UTRAN)) and the core network (e.g., evolved packet core (EPC)) 120 coupled together through an S1 interface 115. (Note that for convenience and brevity sake, only a portion of the core network, as well as the RAN, is shown.

The core (EPC) 120 includes mobility management entity (MME) 122, serving gateway (serving GW) 124, and packet data network gateway (PDN GW) 126. The RAN includes enhanced node B's (eNBs) 104 (which may operate as base stations) for communicating with user equipment (UE) 102. The eNBs 104 may include macro eNBs and low power (LP) eNBs.

The MME is similar in function to the control plane of legacy Serving General Packet Radio Service (GPRS) Support Nodes (SGSN). It manages mobility aspects in access such as gateway selection and tracking area list management. The serving GW 124 terminates the interface toward the RAN, and routes data packets between the RAN and core network. In addition, it may be a local mobility anchor point for inter-eNB handovers and also may provide an anchor for inter-3GPP mobility. Other responsibilities may include lawful intercept, charging, and some policy enforcement. The serving GW 124 and the MME 122 may be implemented in one physical node or separate physical nodes. The PDN GW 126 terminates a SGi interface toward the PDN. It routes data packets between the EPC 120 and the external PDN, and may be a key node for policy enforcement and charging data collection. It may also provide an anchor point for mobility with non-LTE accesses. The external PDN can be any kind of IP network, as well as an IP Multimedia Subsystem (IMS) domain. The PDN GW 126 and the serving GW 124 may be implemented in one physical node or separated physical nodes.

The eNBs 104 (macro and micro) can terminate the air interface protocol and are usually (if not always) the first point of contact for a UE 102. In some embodiments, an eNB 104 may fulfill various logical functions for the RAN including but not limited to radio network controller (RNC) functions, such as radio bearer management, uplink and downlink dynamic radio resource management and data packet scheduling, and mobility management.

The S1 interface 115 is the interface that separates the RAN and the EPC 120. It is split into two parts: the S1-U, which carries traffic data between the eNB 104 and the serving GW 124, and the S1-MME, which is a signaling interface between the eNB 104 and the MME 122. The X2 interface is the interface between eNBs 104 (at least between most, as will be addressed below regarding micro eNBs). The X2 interface comprises two parts: the X2-C and X2-U. The X2-C is the control plane interface between eNBs 104, while the X2-U is the user plane interface between eNBs 104.

With cellular networks, LP cells are typically used to extend coverage to indoor areas where outdoor signals do not reach well, or to add network capacity in areas with very dense phone usage, such as train stations. As used herein, the term low power (LP) eNB refers to any suitable relatively low power eNB for implementing a narrower cell (narrower than a macro cell) such as a femtocell, a picocell, or a micro cell. Femtocell eNBs are typically provided by a mobile network operator to its residential or enterprise customers. A femtocell is typically the size of a residential gateway or smaller and generally connects to the user's broadband line. Once plugged in, the femtocell connects to the mobile operator's mobile network and provides extra coverage in a range of typically 30 to 50 meters for residential femtocells. Thus, a LP eNB might be a femtocell eNB since it is coupled through the PDN GW 126. Similarly, a picocell is a wireless communication system typically covering a small area, such as in-building (offices, shopping malls, train stations, etc.) or, more recently, in-aircraft. A picocell eNB can generally connect through the X2 link to another eNB such as a macro eNB through its base station controller (BSC) functionality. Thus, LP eNB 104 could be implemented with a picocell eNB since it is coupled to a macro eNB via an X2 interface. Picocell eNBs or other LP eNBs may incorporate some or all functionality of a macro eNB. In some cases, this may be referred to as an access point base station or enterprise femtocell.

DPTX architectures are very attractive for modern radios because such architectures can provide improved area and power consumption characteristics compared with conventional analog architectures. In accordance with some embodiments, a UE 102 or an eNB 104 may include a transmitter amplifier that includes an input inductor, a switch, and a CDAC. In certain examples, the switch can have a control node and a first switched node coupled to the input inductor. In certain examples, the CDAC can receive a digital representation of the amplitude signal and can provide a first analog representation of the amplitude signal. The transmitter amplifier can be configured to receive the first analog representation of the amplitude signal at the first switched node, receive a second analog representation of the amplitude signal from the inductor, receive a phase signal at the control node, and provide a first modulated signal using the phase signal, the first analog representation of the amplitude signal and the second analog representation of the amplitude signal.

Figure 2:
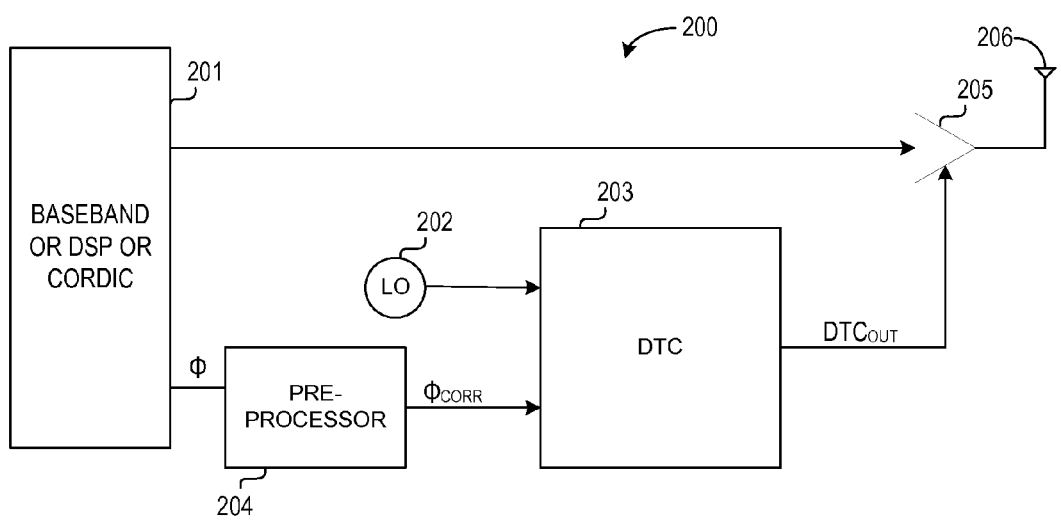
FIG. 2 illustrates generally an example transmitter in accordance with embodiments of the present subject matter.

FIG. 2 illustrates generally a digital polar transmitter 200, according to one embodiment of the present subject matter. The illustrated architecture is shown as an example transmitter radio circuit. It is understood that polar architectures may also be employed in receiver radio circuits. In certain examples, the transmitter 200 may include a processor 201, a local oscillator 202, a digital-to-time converter (DTC) 203, an optional pre-processor 204 for the DTC 203, a power amplifier 205, and an antenna 206. In certain examples, the processor 201 may include a baseband processor such as for a mobile electronic device, a digital signal processor (DSP) or a Cordic converter for providing amplitude and phase modulation information representative of digital transmission data. In certain examples, some known non-linearity of the DTC 203 may be compensated for using the pre-processor 204. In some examples, the pre-processor 204 may receive phase modulation information from the processor 201. In some examples the pre-processor 204 may receive phase ramp information ($\psi$) for providing a desired radio frequency. In certain examples, the pre-processor 204 may adjust or correct the received processor information to provide corrected information ($\psi_{CORR}$) to compensate for at least some of the non-linearity of the DTC 203. In certain examples, the DTC 203 may receive reference clock information from the local oscillator 202 and the corrected processor information ($\psi_{CORR}$) from the pre-processor 204. The DTC 203 may provide an output signal ($DTC_{OUT}$) at a desired frequency using the local oscillator 202 and the corrected processor information ($\omega_{CORR}$). For transmitter examples, the power amplifier 205 may mix the output signal ($DTC_{OUT}$) with amplitude information to provide a transmission signal. The antenna 206 may broadcast the transmission signal for reception by a second device.

Polar modulation techniques may require linear wideband transmitters with efficient operation at all output levels. In certain modulation techniques, such as envelope elimination and restoration (EER), high efficiency may be offered, but high linearity may be a challenge. EER employs a phase modulated constant-envelope signal that is mixed with an envelope varying amplitude signal resulting in an output signal having both envelope and phase information. A mixing amplifier for an EER modulation technique should have linear voltage gain and high efficiency over the dynamic range of the phase modulated signal and the amplitude signal. Class-E amplifiers may fulfill many of the requirements for an EER modulation technique. In addition to EER, another existing technique for modulation is called envelope tracking (ET). ET may adjust the supply voltage for an E-class amplifier to deliver power at each needed instant. An advantage of an ET technique over an EER technique is that timing mismatch in the nanosecond region between the phase and amplitude signals may be improved. However, efficiency of ET techniques may be limited by the linear power amplifier.

Therefore, for higher modulation bandwidth requirements such as those associated with LTE systems, E-Class amplifiers suffer from a limit for signal modulation bandwidth. Even if the envelope signal can be supplied with proper bandwidth, which is not possible with high efficiency, the E-class amplifier cannot transfer the envelope signal bandwidth.

The present subject matter recognizes that a combination of a switched mode power amplifier and a CDAC can efficiently provide a radio frequency (RF) signal that is generated by modulating a supply of the switched mode power amplifier with low frequency components and can restore high frequency components of the modulated signal using the CDAC.

Figure 3:
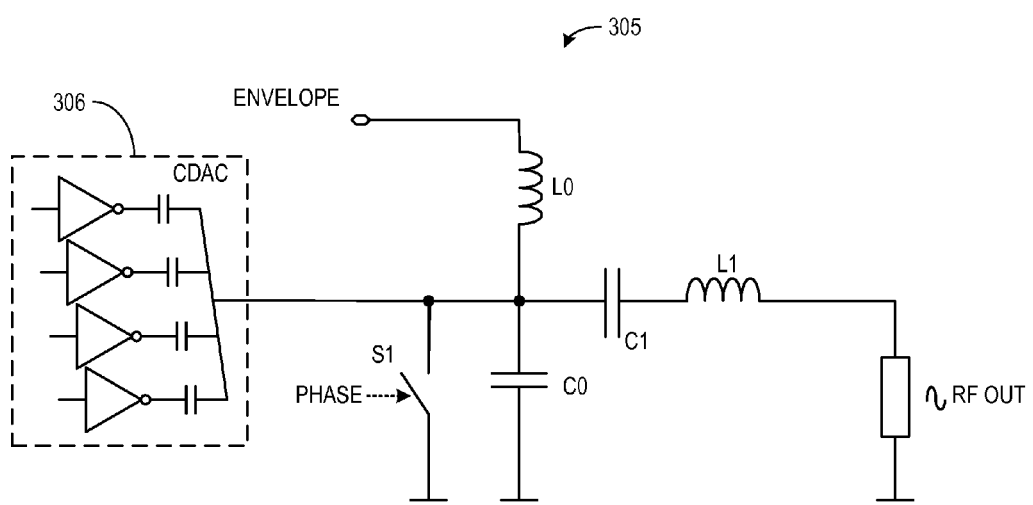
FIG. 3 illustrates generally an example amplifier system in accordance with the present subject matter.

FIG. 3 illustrates generally an amplifier system 305 according to various examples of the present subject matter. The amplifier system 305 may include a switched-mode power amplifier and a CDAC 306. The switched-mode power amplifier may include a choke (L0), a switch (S1), a shunt capacitor circuit (C0) including one or more discrete capacitors, and an output inductor-capacitor (L-C) circuit (C1, L1). The switch-mode power amplifier can receive an analog envelope signal (ENVELOPE) representative of digital communication information at the choke (L0), such as digital communication information from a baseband processor. The control terminal of the switch (S1) can receive an analog, phase-modulated signal (PHASE) representative of the digital communication information. An output of the CDAC 306 can be received at a first node common to the choke (L0), the shunt capacitor circuit (C0) and the output L-C circuit (C1, L1). The CDAC 306 can receive a digital representation of the digital communication information or a portion thereof. In some examples, the CDAC 306 can receive a digital representation of the envelope of the digital communication information. In certain examples, such as the apparatus illustrated in FIG. 3, the CDAC 306 can restore high frequency components of the communication information to the RF signal.

Figure 4:
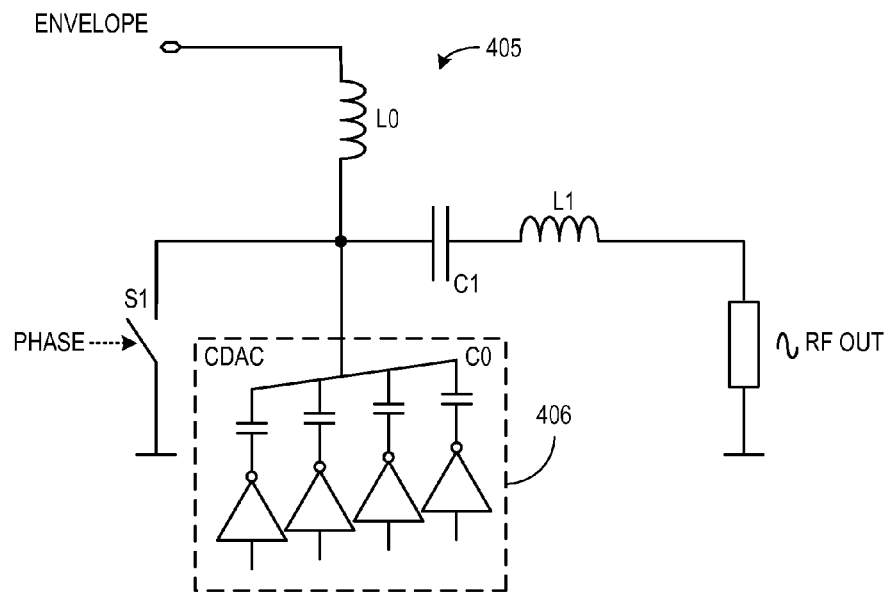
FIG. 4 illustrates generally an example amplifier system in accordance with the present subject matter.

FIG. 4 illustrates generally an amplifier system 405, according to various examples of the present subject matter. The amplifier system 405 may include a switched-mode power amplifier employing a CDAC 406 as a shunt capacitor circuit (C0). In certain examples, the switch-mode power supply may include a choke (L0), a switch (S1), a shunt capacitor circuit (C0) including a CDAC 406 and an output stage L-C circuit (C1, L1). The illustrated amplifier system 405 further simplifies the amplifier system 305 of FIG. 3 while maintaining the wideband and linearity benefits of the combination of the E-class amplifier and CDAC. In certain examples, in back off, the combined amplifier can work similar to a Doherty power amplifier where the smaller of the two combined circuits delivers the power.

Figure 5A:
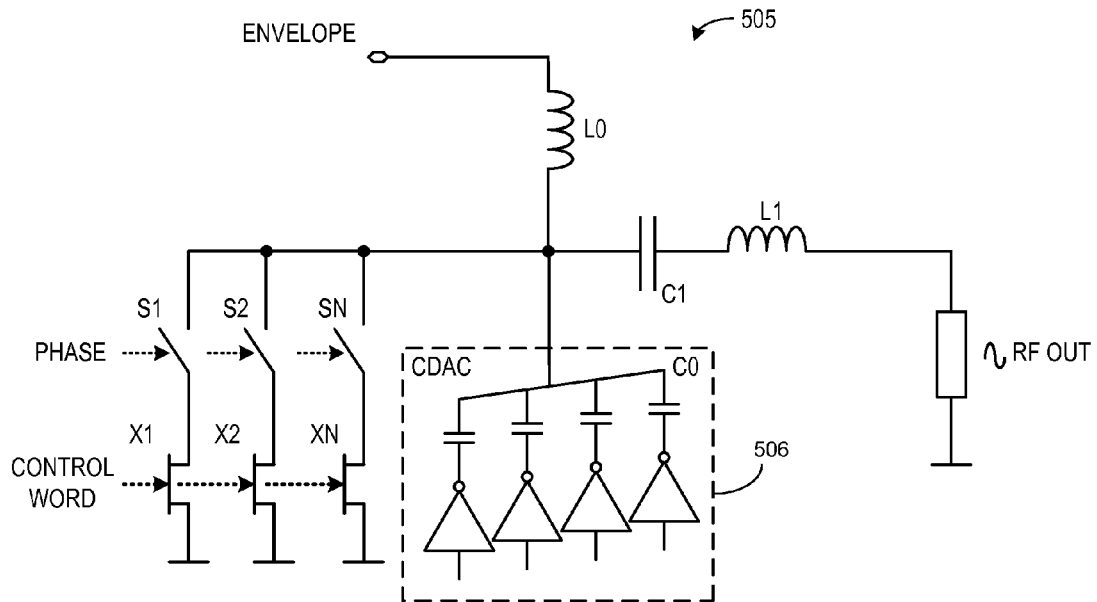
FIGS. 5A and 5B illustrate examples of power controllable E-class amplifiers employing capacitive digital-to-analog converters (CDACs), in accordance with the present subject matter.
Figure 5B:
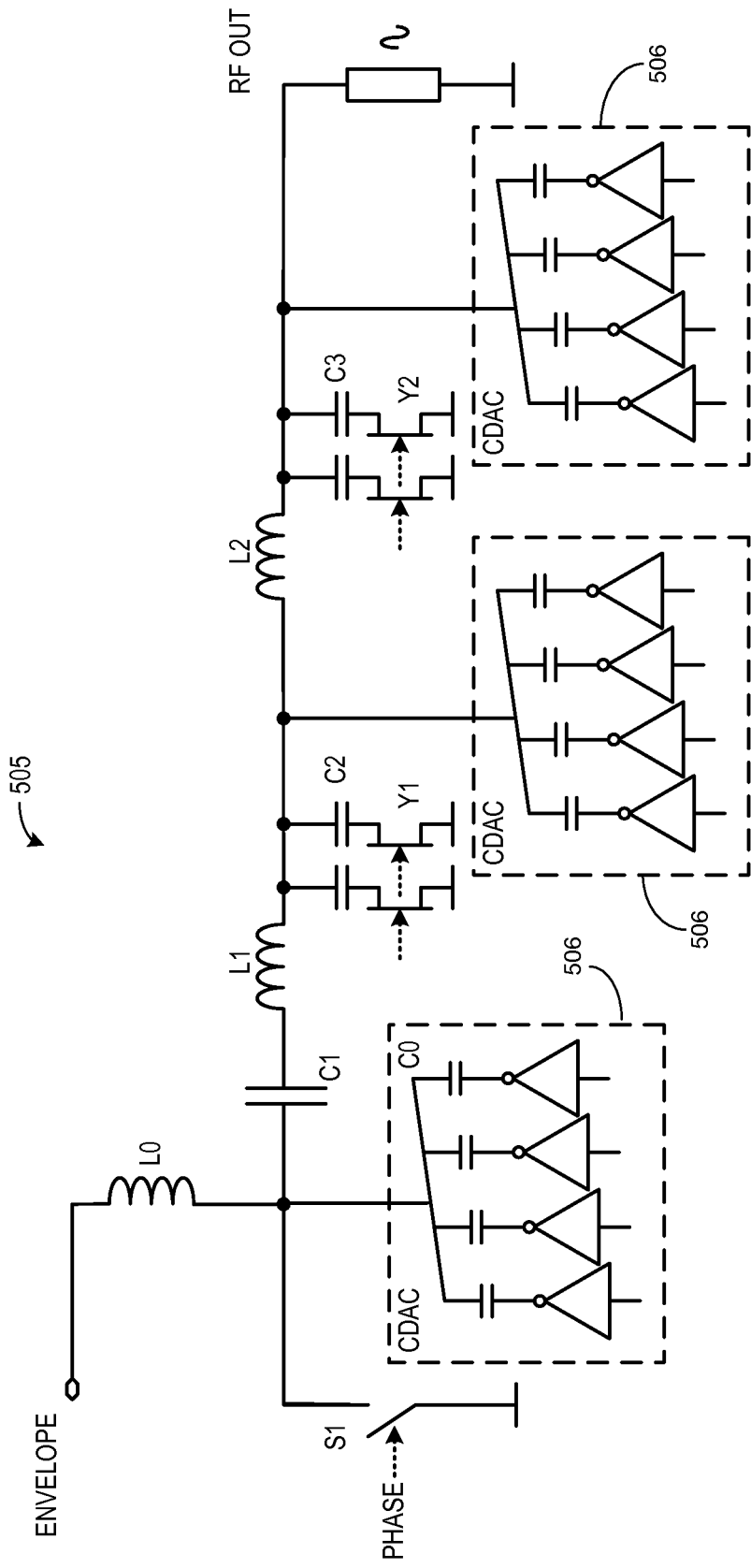

FIGS. 5A and 5B illustrate examples of power controllable E-class amplifiers 505 employing CDACs 506 in accordance with various examples of the present subject matter. A control word can use power selection switches or transistors (X1, X2, XN) to enable or disable additional current paths associated with modulating the choke current to adjust the power of the power controllable E-class amplifier 505. In certain examples, one or more phase switches (S1, S2, SN) may be coupled in parallel with each other and in series with the input inductor or choke (L0). In some examples, the power selection switches (X1, X2, XN) may be in series with a corresponding phase switch (S1, S2, SN). Tuning the capacitors (C2, C3) of the one or more output matching networks using one or more tuning switches (Y1, Y2) can control the output power of the power controllable E-class amplifier 505. The CDACs 506 in each of the one or more output matching networks can assist in restoring high frequency components of the RF signal at each different output power setting.

Figure 6A:
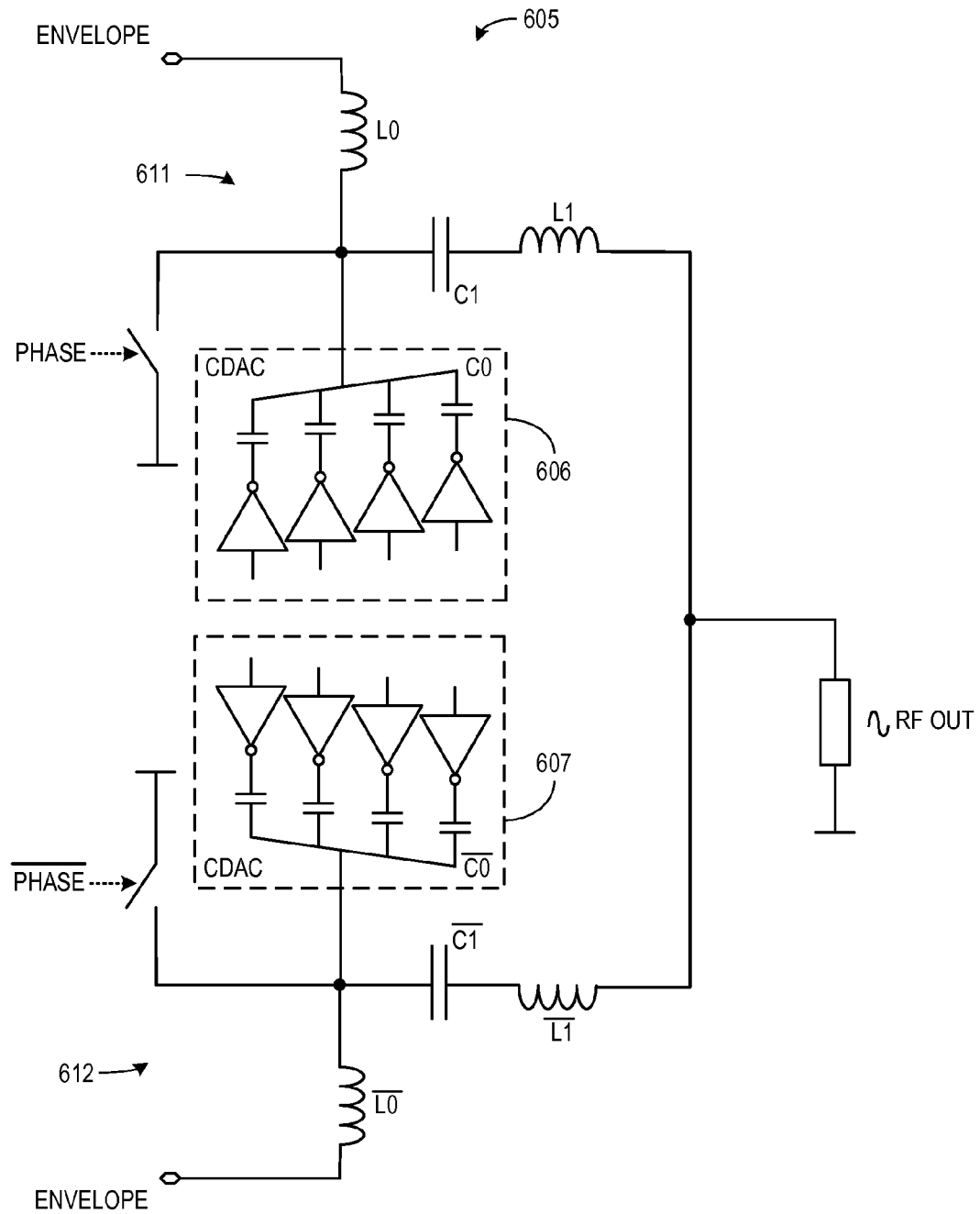
FIGS. 6A, 6B and 6C illustrate quasi-differential output examples of a combination switch-mode power amplifier and CDAC, in accordance with the present subject matter.
Figure 6B:
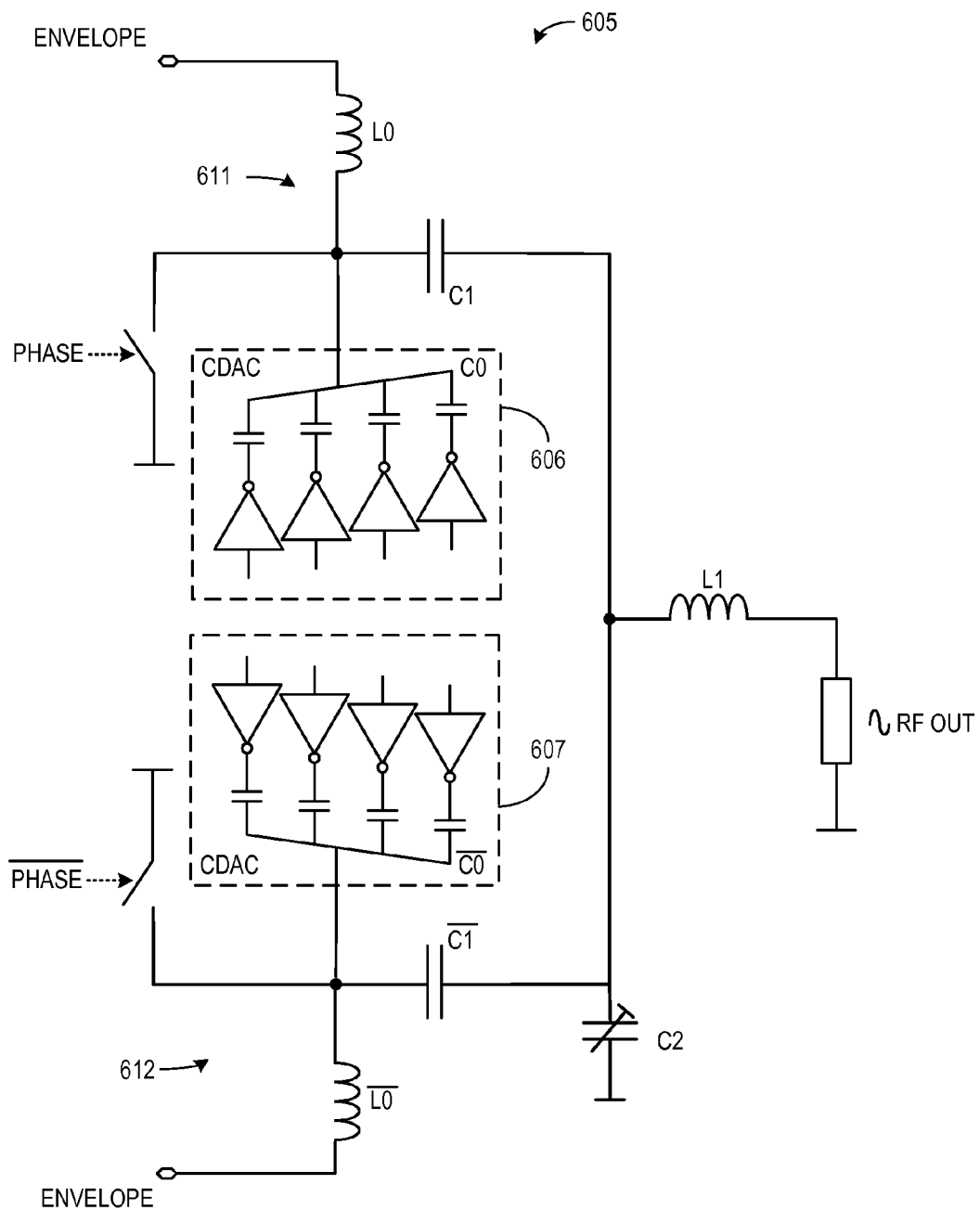
Figure 6C:
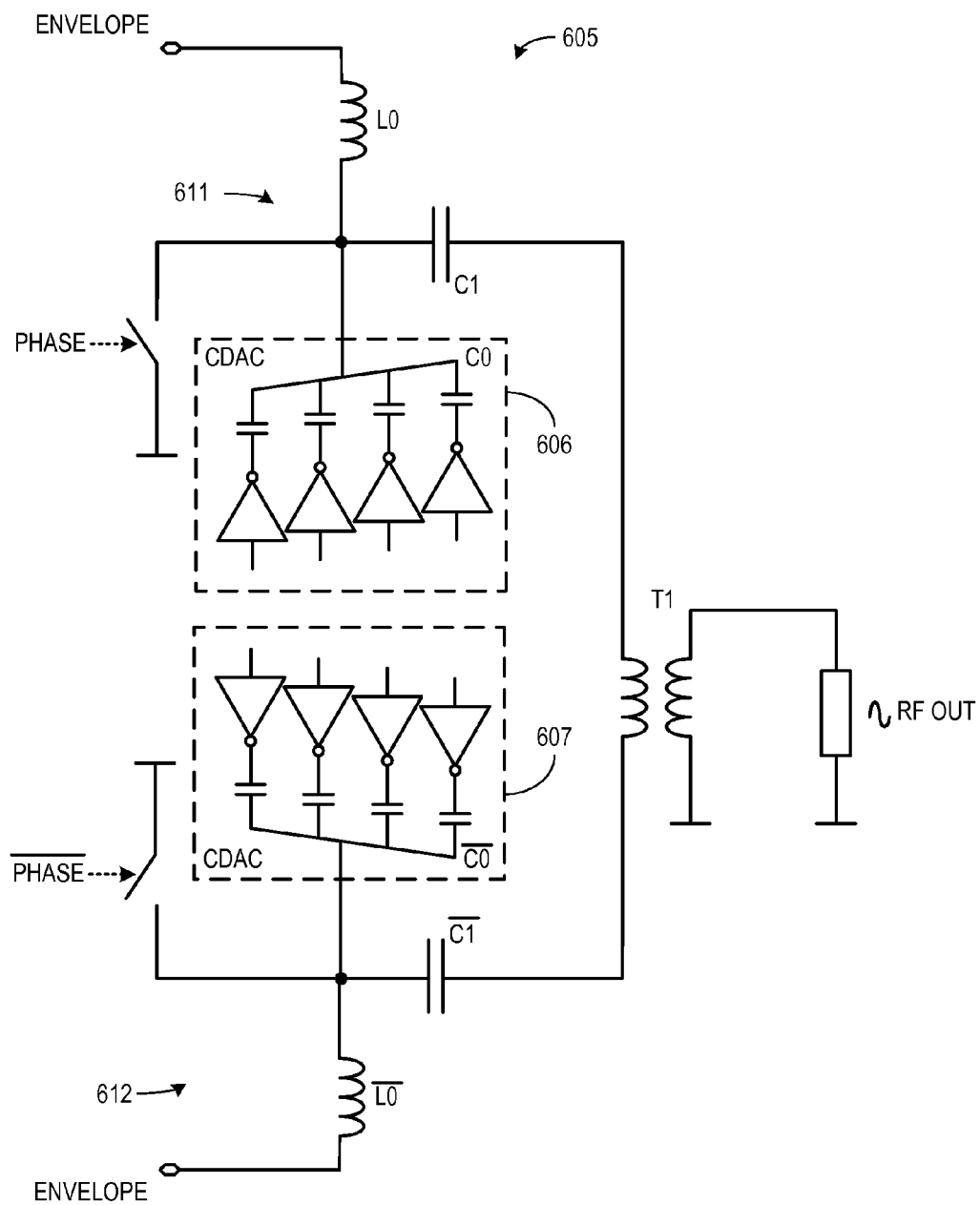

FIGS. 6A, 6B and 6C illustrate quasi-differential output examples of a transmitter or transmitter amplifier 605 including a switch-mode power amplifier and CDAC in accordance with various examples of the present subject matter. The amplifiers 605 may include a first differential output circuit 611, and a second differential output circuit 612 each coupled to the output of the power amplifier 605. Referring to FIG. 6A, the first differential output circuit 611 may include a choke (L0), first phase controlled switch (PHASE), a first shunt capacitor circuit (C0) including a first CDAC 606 and first output L-C circuit (L1, C1). The second differential output circuit 612 may include a second choke ($\overline{L0}$), second phase controlled switch ($\overline{PHASE}$), a shunt capacitor circuit ($\overline{C0}$) including a second CDAC 607 and second output L-C circuit ($\overline{L1},\overline{C1}$). The L-C output circuits of each output circuit may be coupled to a load to provide an RF signal. In certain examples, the second phase controlled switch ($\overline{PHASE}$) is coupled to receive a complement of the control signal of the first phase controlled switch (PHASE). Referring to FIG. 6B, the quasi-differential amplifier 605 includes a single output inductor (L1) coupled between the two differential output paths and the load. In certain examples, the transmitter amplifier 605 may include an adjustable output trim capacitor (C2) coupled between a voltage reference such as ground and the output of the two differential output paths. Referring to FIG. 6C, the quasi-differential amplifier 605 may include an output transformer (T1) instead of one or more output inductors.

Figure 7:
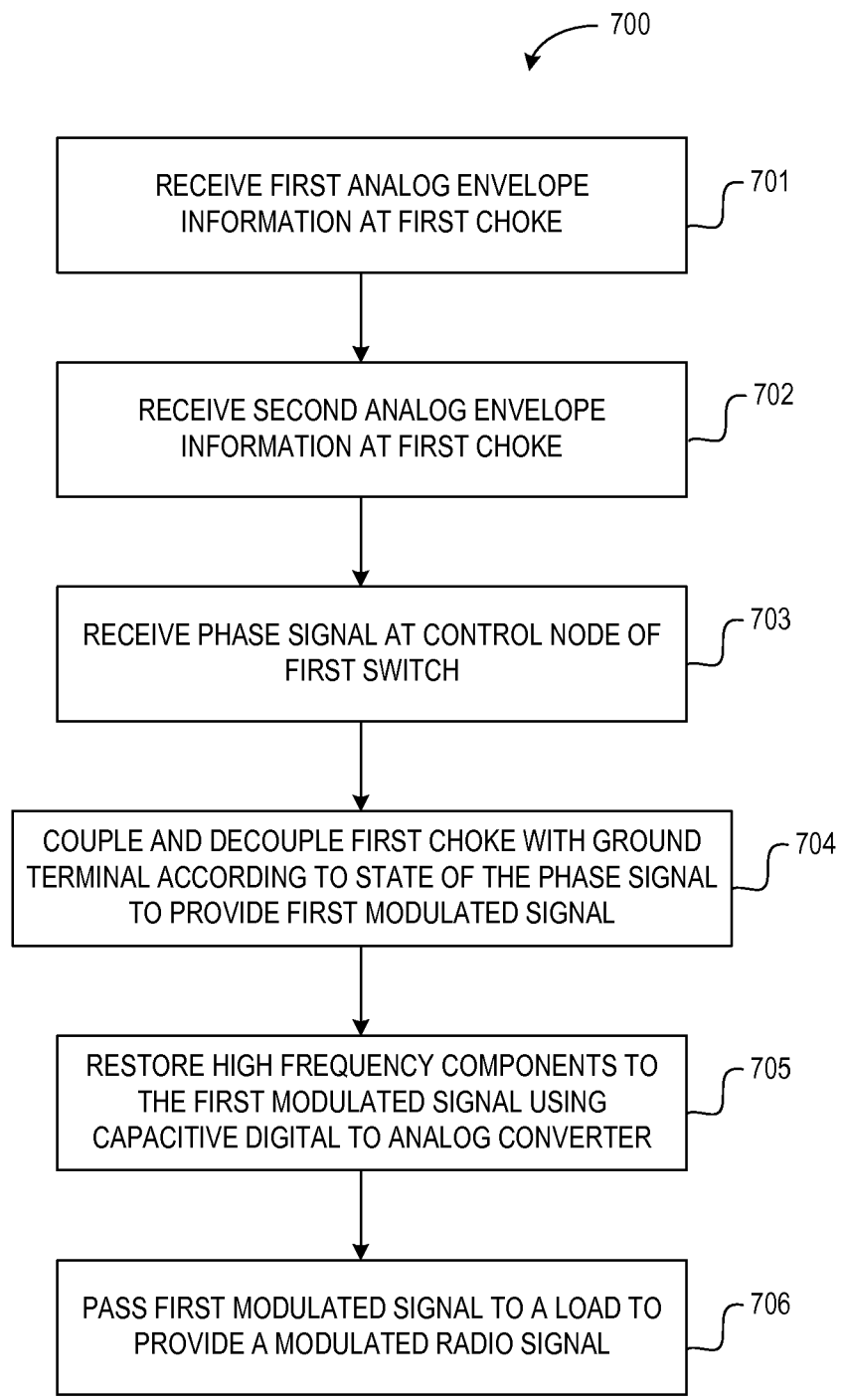
FIG. 7 illustrates generally a flowchart of an example method for operating a CDAC-based amplifier according to various examples of the present subject matter.

FIG. 7 illustrates generally a flowchart of a method 700 for providing a modulated radio frequency signal according to various examples of the present subject matter. The method 700 may include at 701 receiving a first analog representation of envelope information of transmission information at a first node of a first choke of a transmitter amplifier. At 702, the method 700 may include receiving a second analog representation of the envelope information at a second node of the first choke. At 703, the method 700 may include receiving a phase signal at a control node of a first switch of the transmitter amplifier. At 704, the method 700 may include coupling and decoupling the first choke to a ground terminal in accordance with a state of the phase signal using the first switch. At 705, the method 700 may include restoring high frequency components of the transmission information to a first modulated signal using a digital representation of the envelope information and a first CDAC coupled to the first switch and the first choke. The first CDAC may be configured to provide the second analog representation of the envelope information. At 706, the method 700 may include passing the first modulated signal to a load, such as one or more antennas, to provide a wireless modulated radio frequency signal.

ADDITIONAL NOTES

In Example 1, a transmitter amplifier can include a switch having a control node and a switched node, the switched node coupled to an input inductor, and a capacitive digital-to-analog converter (CDAC) configured to receive a digital representation of an amplitude signal and to provide a first analog representation of the amplitude signal. The transmitter amplifier can be configured to receive the first analog representation of the amplitude signal at the switched node, to receive a second analog representation of the amplitude signal from the input inductor, to receive a phase signal at the control node, and to provide a modulated signal using the phase signal, the first analog representation of the amplitude signal and the second analog representation of the amplitude signal.

In Example 2, the amplifier of Example 1 optionally is a class-E amplifier.

In Example 3, the amplifier of any one or more of Examples 1-2 optionally is a switch-mode power amplifier.

In Example 4, the amplifier of any one or more of Examples 1-3 optionally includes a shunt capacitor circuit coupled to the switched node.

In Example 5, the shunt capacitor circuit of any one or more of Examples 1-4 optionally includes the CDAC.

In Example 6, the transmitter amplifier of any one or more of Examples 1-5 optionally includes the input inductor, an output capacitor having a node coupled to the switch, the input inductor and the shunt capacitor circuit, and an output inductor coupled in series with the output capacitor and an output of the transmitter amplifier.

In Example 7, the transmitter amplifier of any one or more of Examples 1-6 optionally includes a plurality of selectable capacitors coupled to the output inductor, each selectable capacitor of the plurality of selectable capacitors including a capacitor and a selection switch.

In Example 8, the switch of any one or more of Examples 1-7 optionally includes a plurality of phase switches coupled in parallel with each other, the plurality of phase switches coupled in series with the input inductor and configured to receive the phase signal at a control node of each phase switch, and a plurality of power selection switches, each power selection switch coupled in series with a corresponding phase switch of the plurality of phase switches and configured to receive a power control signal at a control node of each power selection switch.

In Example 9, the CDAC of any one or more of Examples 1-8 optionally is a first CDAC, and the transmitter amplifier of any one or more of Examples 1-8 optionally includes a first differential output circuit and a second differential output circuit. The second differential output circuit can include a second input inductor, a second switch having a switched node coupled to the second input inductor, and a control node, wherein the second differential output circuit is configured to receive a third analog representation of the amplitude signal at the switched node of the second switch, receive the second analog representation of the amplitude signal from the second input inductor, to receive a complement of the phase signal at the control node of the second switch, and provide a second modulated signal using the complement of the phase signal, the first analog representation of the amplitude signal and the second analog representation of the amplitude signal. A second CDAC of the second differential output circuit can be configured to receive the digital representation of the amplitude signal and to provide the third analog representation of the amplitude signal. The first differential output circuit can include the input inductor, the switch and the first CDAC.

In Example 10, the first differential output circuit of any one or more of Examples 1-9 optionally includes a first output inductor and the second differential output circuit includes a second output inductor.

In Example 11, the transmitter amplifier of any one or more of Examples 1-10 optionally includes an output inductor configured to couple both the first differential output circuit and the second differential output circuit to a load.

In Example 12, the transmitter amplifier of any one or more of Examples 1-11 optionally includes an adjustable output capacitor configured to couple the first differential output path, the second differential output path, and the single output inductor to a reference potential.

In Example 13, the output inductor of any one or more of Examples 1-12 optionally includes a transformer.

In Example 14, a method of providing a modulated radio frequency signal using a capacitive digital-to-analog converter (CDAC)-based amplifier can include receiving a first analog representation of envelope information of transmission information at a first node of a first choke of a transmitter amplifier, receiving a second analog representation of the envelope information at a second node of the first choke, receiving a phase signal at a control node of a switch of the transmitter amplifier, coupling and decoupling the first choke to a ground terminal in accordance with a state of the phase signal using the switch, restoring high frequency components of the transmission information to a first modulated signal using a digital representation of the envelope information and a first CDAC coupled to the switch and the first choke, the first CDAC configured to provide the second analog representation of the envelope information, and passing the first modulated signal to a load to provide the modulated radio frequency signal.

In Example 15, the method of any one or more of Examples 1-14 optionally includes receiving the first analog representation of envelope information of transmission information at a first node of a second choke of a transmitter amplifier, receiving a third analog representation of the envelope information at a second node of the second choke, receiving a complement of the phase signal at a control node of a second switch of the transmitter amplifier, coupling and decoupling the second choke to a ground terminal in accordance with a state of the complement of phase signal using the second switch, restoring high frequency components of the transmission information to a second modulated signal using the digital representation of the envelope information and a second CDAC coupled to the second switch and the second choke, the second CDAC configured to provide the third analog representation of the envelope information, wherein the first modulated signal and the second modulated signal provide a differential modulated output, and wherein the method includes passing the second modulated signal to the load with the first modulated signal to provide the modulated radio frequency signal.

In Example 16, the method of any one or more of Examples 1-2 optionally includes receiving a plurality of power selection signals at a plurality of power selection transistors of the transmitter amplifier, and selectively coupling one or more of a plurality of power selection capacitors to an output inductor of the amplifier transmitter using the power selection transistors.

In Example 17, a digital transmitter for a wireless network can include a power amplifier arranged to generate wireless signals based on a first analog amplitude signal and a phase signal, and a digital-to-time converter (DTC) arranged to generate a phase-modulated signal. The power amplifier can include an input inductor, a switch having a switched node coupled to the input inductor, and a control node, the amplifier configured to receive the first analog amplitude signal at the switched node, to receive a second analog amplitude signal from the inductor, to receive the phase signal at the control node, and to provide a modulated signal using the phase signal, the first analog amplitude signal and the second analog amplitude signal, and a capacitive digital-to-analog converter (CDAC) configured to receive a digital representation of the first amplitude signal and to provide the second analog representation of the amplitude signal.

In Example 18, the power amplifier of any one or more of Examples 1-17 optionally includes a shunt capacitor circuit coupled to the first input, an output capacitor having a node coupled to the switch, the input inductor and the shunt capacitor circuit, and an output inductor coupled in series with the output capacitor and an output of the transmitter amplifier.

In Example 19, the power amplifier of any one or more of Examples 1-18 optionally includes a plurality of selectable capacitors coupled to the output inductor, each selectable capacitor of the plurality of selectable capacitors including a capacitor and a selection switch.

In Example 20, the shunt capacitor circuit of any one or more of Examples 1-19 optionally is the CDAC.

In Example 21, the digital transmitter of any one or more of Examples 1-20 optionally includes one or more antenna coupled to the power amplifier.

Example 22 can include, or can optionally be combined with any portion or combination of any portions of any one or more of Examples 1 through 21 to include, subject matter that can include means for performing any one or more of the functions of Examples 1 through 21, or a machine-readable medium including instructions that, when performed by a machine, cause the machine to perform any one or more of the functions of Examples 1 through 21.

The above detailed description includes references to the accompanying drawings, which form a part of the detailed description. The drawings show, by way of illustration, specific embodiments in which the present subject matter can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the present subject matter should be determined with reference to the appended claims, along with the full scope of equivalents to which such claims are legally entitled.

What is claimed is:

1. A transmitter amplifier comprising:
   a switch having a control node and a switched node, the switched node coupled to an input inductor; and
   a capacitive digital-to-analog converter (CDAC) configured to receive a digital representation of an amplitude signal and to provide a first analog representation of the amplitude signal; and
   wherein the transmitter amplifier is configured to receive the first analog representation of the amplitude signal at the switched node, to receive a second analog representation of the amplitude signal from the input inductor, to receive a phase signal at the control node, and to provide a modulated signal using the phase signal, the first analog representation of the amplitude signal and the second analog representation of the amplitude signal; and
   wherein the CDAC is configured to restore high frequency components of the amplitude signal to the modulated signal.

2. The transmitter amplifier of claim 1, wherein the amplifier is a class-E amplifier.

3. The transmitter amplifier of claim 1, wherein the amplifier is a switch-mode power amplifier.

4. The transmitter amplifier of claim 1, wherein the amplifier includes a shunt capacitor circuit coupled to the switched node.

5. The transmitter amplifier of claim 4, wherein the shunt capacitor circuit includes the CDAC.

6. The transmitter amplifier f claim 4, including:
   the input inductor;
   an output capacitor having a node coupled to the switch, the input inductor and the shunt capacitor circuit; and
   an output inductor coupled in series with the output capacitor and an output of the transmitter amplifier.

7. The transmitter amplifier of claim 6, including a plurality of selectable capacitors coupled to the output inductor, each selectable capacitor of the plurality of selectable capacitors including a capacitor and a selection switch.

8. The transmitter amplifier of claim 1, wherein the switch includes:
   a plurality of phase switches coupled in parallel with each other, the plurality of phase switches coupled in series with the input inductor and configured to receive the phase signal at a control node of each phase switch; and
   a plurality of power selection switches, each power selection switch coupled in series with a corresponding phase switch of the plurality of phase switches and configured to receive a power control signal at a control node of each power selection switch.

9. A transmitter amplifier comprising;
   a switch having a control node and a switched node, the switched node coupled to an input inductor; and
   a first capacitive digital-to-analog converter (CDAC) configured to receive a digital representation of an amplitude signal and to provide a first analog representation of the amplitude signal, wherein the transmitter amplifier is configured to receive the first analog representation of the amplitude signal at the switched node, to receive a second analog representation of the amplitude signal from the input inductor, to receive a phase signal at the control node, and to provide a modulated signal using the phase signal, the first analog representation of the amplitude signal and the second analog representation of the amplitude signal;
   a first differential output circuit; and
   a second differential output circuit, the second differential output circuit including:
      a second input inductor;
      a second switch having a switched node coupled to the second input inductor, and
      a control node;
      wherein the second differential output circuit is configured to:
         receive a third analog representation of the amplitude signal at the switched node of the second switch,
         receive the second analog representation of the amplitude signal from the second input inductor, to receive a complement of the phase signal at the control node of the second switch, and
         provide a second modulated signal using the complement of the phase signal, the first analog representation of the amplitude signal and the second analog representation of the amplitude signal; and
      a second CDAC configured to receive the digital representation of the amplitude signal and to provide the third analog representation of the amplitude signal; and
   wherein the first differential output circuit includes the input inductor, the switch and the first CDAC.

10. The transmitter amplifier of claim 9, wherein the first differential output circuit includes a first output inductor and the second differential output circuit includes a second output inductor.

11. The transmitter amplifier of claim 9, including an output inductor configured to couple both the first differential output circuit and the second differential output circuit to a load.

12. The transmitter amplifier of claim 11, including an adjustable output capacitor configured to couple the first differential output path, the second differential output path, and the single output inductor to a reference potential.

13. The transmitter amplifier of claim 11, wherein the output inductor includes a transformer.

14. A method of providing a modulated radio frequency signal using a capacitive digital-to-analog converter (CDAC)-based amplifier, the method comprising:
   receiving a first analog representation of envelope information of transmission information at a first node of a first choke of a transmitter amplifier;
   receiving a second analog representation of the envelope information at a second node of the first choke;
   receiving a phase signal at a control node of a switch of the transmitter amplifier;

coupling and decoupling the first choke to a ground terminal in accordance with a state of the phase signal using the switch;

restoring high frequency components of the transmission information to a first modulated signal using a digital representation of the envelope information and a first CDAC coupled to the switch and the first choke, the first CDAC configured to provide the second analog representation of the envelope information; and passing the first modulated signal to a load to provide the modulated radio frequency signal.

15. The method of claim 14, including:

receiving the first analog representation of envelope information of transmission information at a first node of a second choke of a transmitter amplifier;

receiving a third analog representation of the envelope information at a second node of the second choke;

receiving a complement of the phase signal at a control node of a second switch of the transmitter amplifier;

coupling and decoupling the second choke to a ground terminal in accordance with a state of the complement of phase signal using the second switch;

restoring high frequency components of the transmission information to a second modulated signal using the digital representation of the envelope information and a second CDAC coupled to the second switch and the second choke, the second CDAC configured to provide the third analog representation of the envelope information;

wherein the first modulated signal and the second modulated signal provide a differential modulated output; and wherein the method includes passing the second modulated signal to the load with the first modulated signal to provide the modulated radio frequency signal.

16. The method of claim 14, including:

receiving a plurality of power selection signals at a plurality of power selection transistors of the transmitter amplifier; and selectively coupling one or more of a plurality of power selection capacitors to an output inductor of the amplifier transmitter using the power selection transistors.

17. A digital transmitter for a wireless network comprising:

a power amplifier arranged to generate wireless signals based on a first analog amplitude signal and a phase signal; and a digital-to-time converter (DTC) arranged to generate a phase-modulated signal;

wherein the power amplifier includes:

an input inductor;

a switch having a switched node coupled to the input inductor, and a control node, the amplifier configured to receive the first analog amplitude signal at the switched node, to receive a second analog amplitude signal from the inductor, to receive the phase signal at the control node, and to provide a modulated signal using the phase signal, the first analog amplitude signal and the second analog amplitude signal; and a capacitive digital-to-analog converter (CDAC) configured to receive a digital representation of the first amplitude signal and to provide the second analog representation of the amplitude signal.

18. The digital transmitter of claim 17, wherein the power amplifier includes a shunt capacitor circuit coupled to the first input;

an output capacitor having a node coupled to the switch, the input inductor and the shunt capacitor circuit; and an output inductor coupled in series with the output capacitor and an output of the transmitter amplifier.

19. The digital transmitter of claim 18, wherein the power amplifier includes a plurality of selectable capacitors coupled to the output inductor, each selectable capacitor of the plurality of selectable capacitors including a capacitor and a selection switch.

20. The digital transmitter of claim 18, wherein the shunt capacitor circuit is the CDAC.

21. The digital transmitter of claim 18, further comprising one or more antenna coupled to the power amplifier.

* * * * *

UNITED STATES PATENT AND TRADEMARK OFFICE
CERTIFICATE OF CORRECTION

PATENT NO. : 9,525,383 B2  
APPLICATION NO. : 14/570879  
DATED : December 20, 2016  
INVENTOR(S) : Franz Kuttner Page 1 of 1

It is certified that error appears in the above-identified patent and that said Letters Patent is hereby corrected as shown below:

In the Claims

In Column 9, Line 50, in Claim 6, after "amplifier", delete "f" and insert --of--, therefor In Column 10, Line 4, in Claim 9, delete "comprising;" and insert --comprising:--, therefor Signed and Sealed this  
Ninth Day of July, 2019

Andrei Iancu  
*Director of the United States Patent and Trademark Office*